United States Patent
Kim et al.

(10) Patent No.: US 7,091,666 B2
(45) Date of Patent: Aug. 15, 2006

(54) ORGANIC ELECTROLUMINESCENT DEVICE

(75) Inventors: Seon Hee Kim, Busan Metropolitan (KR); Tae Seung Kim, Busan Metropolitan (KR)

(73) Assignee: Samsung Oled Co., Ltd., Ulsan-si (KR)

( * ) Notice: Subject to any disclaimer, the term of this patent is extended or adjusted under 35 U.S.C. 154(b) by 523 days.

(21) Appl. No.: 10/289,301

(22) Filed: Nov. 7, 2002

(65) Prior Publication Data

US 2003/0111957 A1    Jun. 19, 2003

(30) Foreign Application Priority Data

Dec. 13, 2001    (KR)    ............................... 2001-78961

(51) Int. Cl.
*H01J 17/02*    (2006.01)

(52) U.S. Cl. ...................... 313/609; 313/506; 313/509; 313/586

(58) Field of Classification Search ................ 313/498, 313/505, 506, 509, 512, 586, 584, 609
See application file for complete search history.

(56) References Cited

U.S. PATENT DOCUMENTS

2003/0098645 A1*    5/2003    Lee et al. ................... 313/504

* cited by examiner

*Primary Examiner*—Vip Patel
(74) *Attorney, Agent, or Firm*—Staas & Halsey LLP

(57) ABSTRACT

An organic electroluminescent display (EL) device which can prevent damage to layers due to a deposition mask in forming a light emitter layer or cathode using a deposition mask, and can prevent the short-circuit between a first electrode formed on a transparent substrate and a second electrode corresponding to the first electrode and can prevent deterioration of layer characteristics, and a method of manufacturing the same. The organic EL device includes a substrate made of a transparent material, a first electrode unit having a plurality of electrodes formed on the substrate in a predetermined pattern, a second electrode unit having a plurality of electrodes arranged in a direction crossing the first electrode unit, an electroluminescent layer disposed between the first electrode unit and the second electrode unit and configured to cover at least the first electrode unit and to emit light at the intersection of the first and second electrode units, inter-insulators positioned under the electroluminescent layer so as to cover at least spaces of each of the respective electrodes of the first electrode unit, and configured to define the first electrode unit as a plurality of light emitting areas and to prevent the short-circuit between the first electrode unit and the second electrode unit, and insulating walls positioned on at least one of the top and bottom surfaces of the inter-insulators.

28 Claims, 15 Drawing Sheets

ORGANIC ELECTROLUMINESCENT DEVICE

CROSS-REFERENCE TO RELATED APPLICATIONS

This application claims the benefit of Korean Application No. 2001-78961, filed Dec. 13, 2001, in the Korean Industrial Property Office, the disclosure of which is incorporated herein by reference.

BACKGROUND OF THE INVENTION

1. Field of the Invention

The present invention relates to an organic electroluminescent (EL) device, and more particularly, to an organic EL device having improved structures of electrode patterns and a method of manufacturing the same.

2. Description of the Related Art

Recently, much attention has been paid to EL devices because they have advantageous features suitable for next generation devices, such as a wide viewing angle, a high contrast ratio and a high response speed. EL devices are classified into inorganic EL devices and organic EL devices according to materials to form emitter layers.

In particular, studies of organic EL devices have been briskly carried out because of their advantages, including good characteristics in terms of brightness and response speed, color displaying and so on.

An EL device is basically configured such that an anode is formed on a transparent insulating substrate, e.g., a glass substrate, in a predetermined pattern, a light emitter layer consisting of organic or inorganic layers is formed on the anode, and a cathode having a predetermined pattern is then stacked thereon so as to be orthogonal with the anode.

The organic or inorganic layers have a layered structure of a hole transport layer, a light emitting layer and an electron transport layer sequentially stacked. As described above, the light emitting layer is made of either an organic or inorganic material.

Usable materials of the organic layer include copper phthalocyanine (CuPc), N,N'-di(naphthalene-1-yl)-N,N'-diphenyl-benzidine (NPB) and tris-8-hydroxyquinoline aluminum ($Alq_3$).

In the above-described EL device, when a drive voltage is applied to the anode and the cathode, holes from the anode migrate to the light emitting layer via the hole transport layer and electrons from the cathode migrate to the light emitting layer via the electron transport layer. The holes and the electrons are recombined in the light emitting layer to generate excitons. As the excitons are deactivated to a ground state, fluorescent molecules of the light emitting layer emit light, thereby forming an image.

As described above, EL devices are classified into organic EL devices and inorganic EL devices according to materials for light emitting layers. An explanation will now be given by referring to an organic EL device.

In an organic EL device, an anode formed on the top surface of a substrate in a predetermined pattern is a transparent electrode, e.g., indium tin oxide (ITO), which is ordinarily formed by photolithography. Organic layers are formed on the anode by vacuum deposition and a cathode is then patterned thereon.

In the organic EL device having the above-described configuration, a high precision degree is required in patterning the light emitting layer of the organic layers and patterning a cathode corresponding to an anode, and a variety of techniques have been proposed.

One of typical methods of forming a cathode having a predetermined pattern is photolithography. If the cathode is formed by photolithography, there is, however, a problem in that, when the cathode is selectively etched using a photoresist, the photoresist is stripped off or development is carried out, moisture may soak into an interface between organic layers and the cathode, resulting in degradation in electroluminescent performance due to deteriorated characteristics of the organic layer, a low luminous efficiency, and a shortened life due to stripping of the cathode.

For overcoming those problems arising due to moisture ingress, a new method using vacuum deposition in which an evaporation mask is employed has been utilized to form organic layers or cathodes. However, it is quite difficult to form fine patterns on a large substrate using an evaporation mask. Currently, studies of vacuum deposition to form finer patterns are being briskly carried out.

Recently known methods to solve the above-described problems include vacuum deposition using a cathode separator as disclosed in U.S. Pat. No. 5,701,055, which is illustrated in FIG. 1. This will now be described in detail.

First, an anode 2 is patterned on a transparent substrate 1, and cathode separators 5 whose top portions are wider than the bottom portions are formed thereon so as to be arranged perpendicular to the anode 2. Organic layers 3 are formed between each of the cathode separators 5 and cathodes 4 are blanket-deposited thereon, thereby attaining the same effect as patterning the cathodes 4 on portions where the cathode separators 5 are not formed.

In the above-described configuration, in order to provide a cathode patterning effect by the cathode separators 5, the top portions of the cathode separators 5 must be wider than the bottom portions thereof. Also, the organic layers 3 are formed on the anode 2 and the cathodes 4 are formed to be narrower than the organic layers 3, thereby preventing the short-circuit between the anode 2 and the cathodes 4 due to the organic layers 3. According to this method using the shade of a separator, however, highly accurate patterning and high-speed deposition cannot be achieved under the conditions of variable deposition rates and a large amount of material deposited. Also, since portions where the cathodes 4 are not formed corresponding to the shade exist in the organic layers 3, these portions are susceptible to ingress of moisture, resulting in deterioration of the organic layers 3. The deterioration of the organic layers 3 may cause the short-circuit of the anode 2 and the cathodes 4.

Another method of using cathode separators recently having been used in depositing cathodes utilizes a deposition mask such that slits of the deposition mask are arranged between the cathode separators 5 illustrated in FIG. 1 for cathode deposition. In this case, however, there is a problem in that the cathode separators collapse due to vibration of the deposition mask, resulting in the short-circuit. Korean Patent Application Publication No. 2000-60589 discloses a technology to overcome this problem, that is, auxiliary barriers higher than the cathode separators are provided between the cathode separators.

In another method of forming cathodes, patterned cathodes are directly formed using a deposition mask. This method also has many problems, that is, the thin slit-shaped deposition mask may experience a sag of its central portion in a larger substrate, causing damage to organic layers or cathodes, thereby adversely affecting the yield. The sag also makes it impossible to form cathodes having finer patterns.

A known technique to solve the sag problem of a deposition mask includes disposing a magnetic medium at the opposite side of the deposition mask and closely contacting the deposition mask with an organic layer. However, close contact of the deposition mask may cause the organic layer to be damaged, resulting in the short-circuit between an anode and a cathode.

In order to prevent the damage of an organic layer due to a deposition mask, Japanese Patent Laid-Open Publication No. hei 10-241859 discloses an organic electroluminescent device having partition walls 6 with a predetermined height formed between the respective lines of an anode 2', as illustrated in FIG. 2A. That is, the partition walls 6 with a predetermined height are formed between lines of the anode 2' with a predetermined pattern on a transparent substrate 1', and an organic layer 3' and a cathode 4' are then formed on the substrate 1' having the partition walls 6. In forming the cathode 4' using a deposition mask, a shielding portion of the deposition mask cannot directly damage the organic layer 3' constituting pixels by the partition walls 6, thereby preventing the short-circuit between the anode and the cathode due to damage to the organic layer 3'.

However, according to this method, a gap (G) between the anode 2' and each of the partition walls 6 makes the organic layer 3' formed at the edge of the anode 2' thinner, as illustrated in FIG. 2B. As a result, the cathode 4' may contact the anode 2' at a lateral portion 7 of the anode 2', causing the short-circuit between the cathode 4' and the anode 2'.

SUMMARY OF THE INVENTION

Accordingly, it is an object of the present invention to provide an electroluminescent (EL) device and method of manufacturing the same, which can prevent damage to layers due to a deposition mask in forming a light emitter layer or cathode using a deposition mask.

It is another object of the present invention to provide an EL device and method of manufacturing the same, which can prevent the short-circuit between a first electrode formed on a transparent substrate and a second electrode corresponding to the first electrode and can prevent deterioration of layer characteristics.

Additional objects and advantages of the invention will be set forth in part in the description which follows and, in part, will be obvious from the description, or may be learned by practice of the invention.

The foregoing and other objects of the present invention are achieved by providing an organic EL device including a substrate made of a transparent material, a first electrode unit having a plurality of electrodes formed on the substrate in a predetermined pattern, a second electrode unit having a plurality of electrodes arranged in a direction crossing the first electrode unit, an electroluminescent layer disposed between the first electrode unit and the second electrode unit and configured to cover at least the first electrode unit and to emit light at the intersection of the first and second electrode units, inter-insulators positioned under the electroluminescent layer so as to cover at least spaces of each of the respective electrodes of the first electrode unit, and configured to define the first electrode unit as a plurality of light emitting areas and to prevent the short-circuit between the first electrode unit and the second electrode unit, and insulating walls positioned on at least one of the top and bottom surfaces of the inter-insulators.

In accordance with another aspect of the present invention, the insulating walls may be formed according to the arrangement pattern of the inter-insulators, or may be formed in a stripe pattern extending parallel to the first or second electrode unit. Also, the insulating walls are formed along the periphery of areas where the inter-insulators are formed, or may include portions formed in a dot pattern having dots not interconnected.

In accordance with another aspect of the present invention, the sum of the height of each of the inter-insulators and the height of each of the insulating walls may be greater than the sum of the height of the first electrode unit and the height of the electroluminescent layer.

Alternatively, the width of each of the insulating walls may be equal to or less than the width of each of the inter-insulators, and the cross-section of each of the insulating walls is preferably trapezoidal so that the surface thereof facing the transparent substrate is wider than the top surface thereof.

Also, the inter-insulators and the insulating walls may be integrally formed.

The foregoing and other objects of the present invention may also be achieved by providing an organic EL device including a substrate made of a transparent material, a first electrode unit having a plurality of electrodes formed on the substrate in a predetermined pattern, a second electrode unit having a plurality of electrodes arranged in a direction crossing the first electrode unit, an electroluminescent layer disposed between the first electrode unit and the second electrode unit and configured to cover at least the first electrode unit and to emit light at the intersection of the first and second electrode units, and inter-insulators positioned under the electroluminescent layer so as to cover at least spaces of each of the respective electrodes of the first electrode unit, and configured to define the first electrode unit as a plurality of light emitting areas and to prevent the short-circuit between the first electrode unit and the second electrode unit, each of the inter-insulators having a height greater than the sum of the height of the first electrode unit and the height of the electroluminescent layer.

Here, the inter-insulators may be formed in a stripe pattern parallel to the first electrode unit or in a lattice pattern covering spaces between each of the respective electrode lines of the first electrode unit and partially covering the first electrode unit. Also, the cross-section of each of the inter-insulators may be trapezoidal so that the surface thereof facing the transparent substrate is wider than the top surface thereof.

The foregoing and other objects of the present invention may also be achieved by providing a method of manufacturing an organic EL device including forming a first electrode unit on a transparent substrate in a predetermined pattern, forming inter-insulators on the transparent substrate so as to cover at least spaces of each of the respective electrodes of the first electrode unit, and patterned to define the first electrode unit as a plurality of light emitting areas, forming insulating walls positioned on at least one of the top and bottom surfaces of the inter-insulators, forming an electroluminescent layer over the first electrode unit, the inter-insulators and the insulating walls, and forming a second electrode unit arranged in a direction crossing the first electrode unit by closely contacting a deposition mask with the top portion of the each of the insulating walls.

In an aspect of this embodiment, the thickness of each of the insulating walls is less than the width of each of the inter-insulators, and the thickness of each of the insulating walls is less than the width of a shielding portion forming slits of the deposition mask. The inter-insulator forming operation and the insulating wall forming operation may be simultaneously performed.

BRIEF DESCRIPTION OF THE DRAWINGS

These and other objects and advantages of the invention will become apparent and more readily appreciated from the following description of the embodiments, taken in conjunction with the accompanying drawings of which.

DETAILED DESCRIPTION OF THE INVENTION

Figure 1:
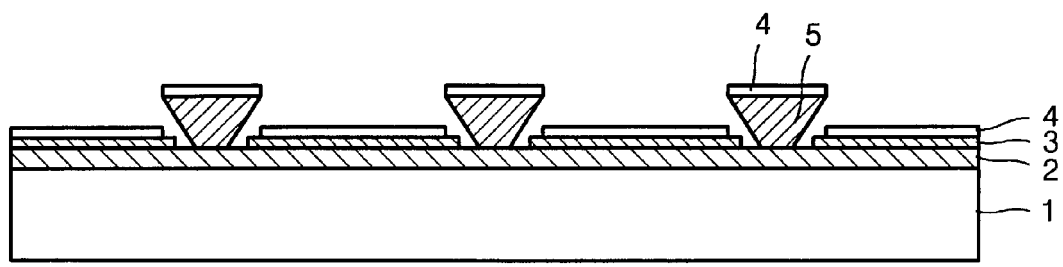
FIG. 1 is a cross-sectional view of a conventional organic EL device employing cathode separators.
Figure 2A:
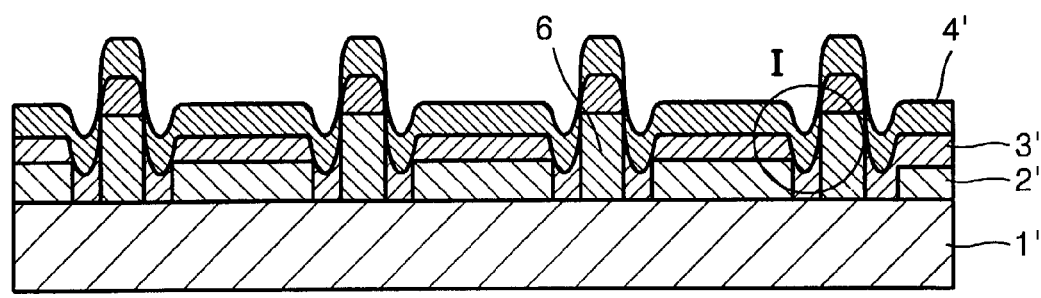
FIG. 2A is a cross-sectional view of a conventional organic EL device employing partition walls parallel to an anode.
Figure 2B:
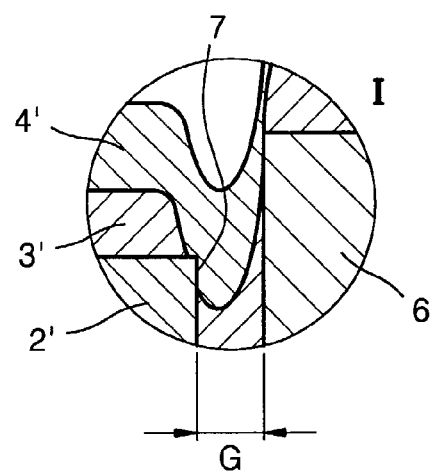
FIG. 2B is an enlarged view of a portion I illustrated in FIG. 2A.

Reference will now be made in detail to the embodiments of the present invention, examples of which are illustrated in the accompanying drawings, wherein like reference numerals refer to like elements throughout. The embodiments are described below in order to explain the present invention by referring to the figures.

The following description of the embodiments is directed mainly to the structure of an organic EL device in which organic compounds are used as light emitter layers. However, the present invention can be applied in the same manner to an inorganic EL device using inorganic compounds as light emitter layers.

Figure 3:
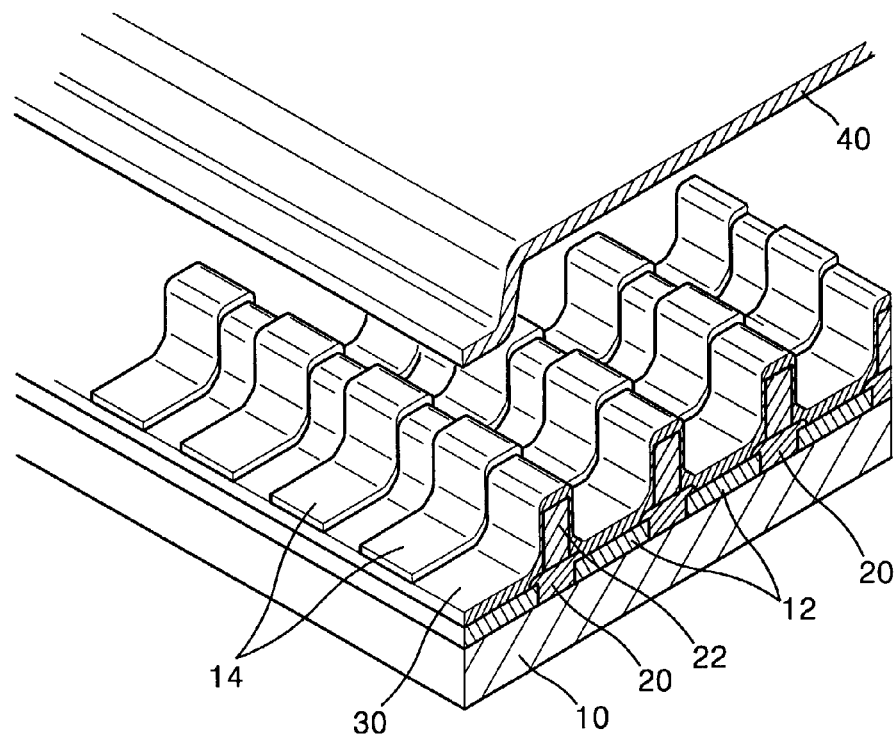
FIG. 3 is a partially exploded perspective view of an organic EL device according to an embodiment of the present invention.
Figure 4:
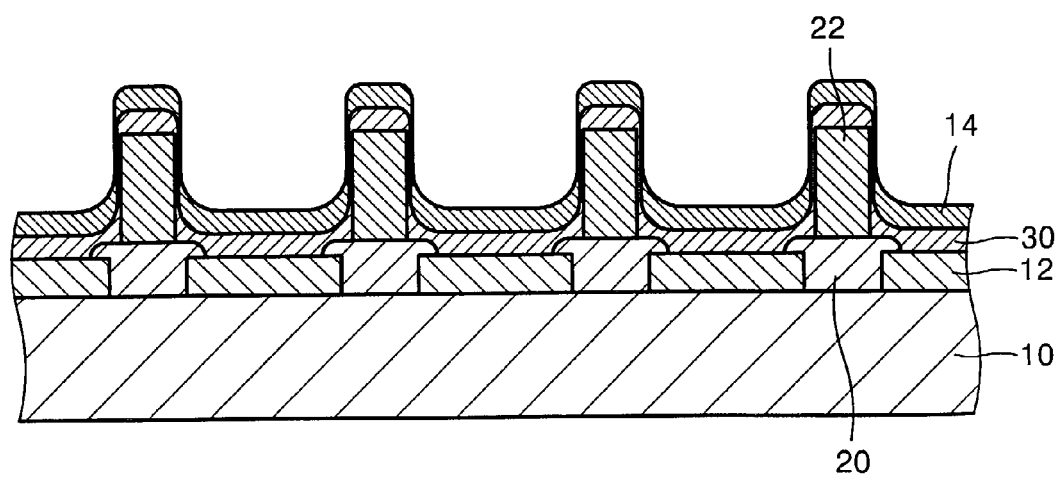
FIG. 4 is a partly cut-away cross-sectional view of the organic EL device illustrated in FIG. 3.

FIG. 3 is a partially exploded perspective view of an organic EL device according to an embodiment of the present invention, and FIG. 4 is a partly cut-away cross-sectional view thereof.

Referring to FIGS. 3 and 4, the organic EL device includes a first electrode unit 12 arranged in a predetermined pattern on a substrate 10 made of a transparent material, and a second electrode unit 14 arranged in a direction crossing the first electrode unit 12. Also, the organic EL device includes an electroluminescent layer, that is, an organic layer 30, where organic electroluminescence occurs by holes and electrons supplied from the first and second electrode units 12 and 14, and a cap 40 forming a predetermined space to protect the organic layer 30 to be hermetically sealed.

Although not shown, a flexible printed circuit board connecting circuits to drive the organic EL device is installed on the cap 40, which will also be applied to the following embodiments of the present invention.

In an aspect of this embodiment, the first electrode unit 12 and the second electrode unit 14 may be formed of stripes spaced apart from and parallel to each other, not necessarily limited to this pattern, and any pattern that can form pixels can be employed, alternatively.

The organic EL device having the above-described construction further includes inter-insulators 20 formed on the transparent substrate 10 and the first electrode unit 12 in a predetermined pattern to define light-emitting areas, i.e., pixels, and insulating walls 22 formed on the inter-insulators 20 in a predetermined pattern, as illustrated in FIGS. 3 and 4.

The inter-insulators 20 to provide insulation between the first electrode unit 12 and the second electrode unit 14, may be formed in various patterns according to the arrangement of light emitting areas, i.e., pixels. In other words, the inter-insulators 20 may be patterned in a stripe form so as to be disposed between each of the respective electrode lines constituting the first electrode unit 12 to be parallel therewith. Alternatively, the inter-insulators 20 may be formed between each of the respective electrode lines constituting the first electrode unit 12 and on the first electrode unit 12 in a lattice form.

The insulating walls 22 formed on the inter-insulators 20 can be made of the same material as that of the inter-insulators 20. The insulating walls 22 are high enough to support a shielding portion of a deposition mask in forming an organic light emitter layer for color display, among cathodes or organic layers. That is to say, as illustrated in FIGS. 3 and 4, the sum of the height of each of the inter-insulators 20 and the height of each of the insulating walls 22 should be greater than the sum of the height of the first electrode unit 12 and the height of the organic layer 30. This is applied in the same manner to all embodiments of the present invention to be described later.

Figure 12:
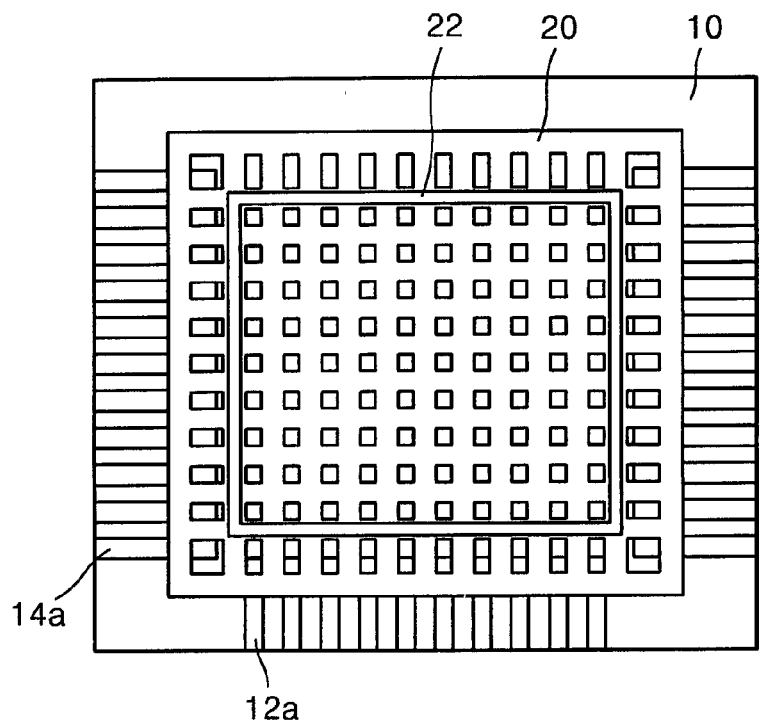
FIGS. 12 through 16 are plan views of partition walls having various patterns, according to additional embodiments of the present invention.
Figure 13:
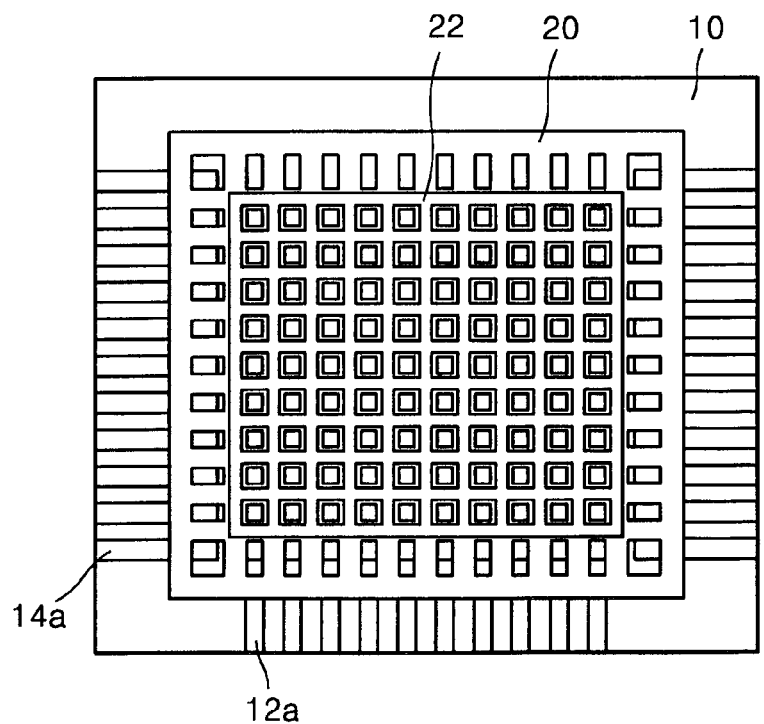
Figure 14:
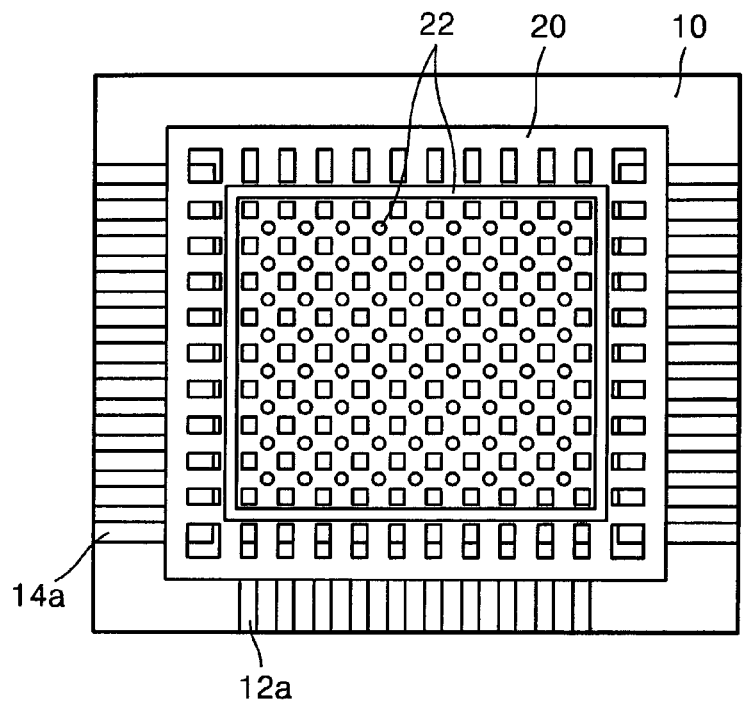
Figure 15:
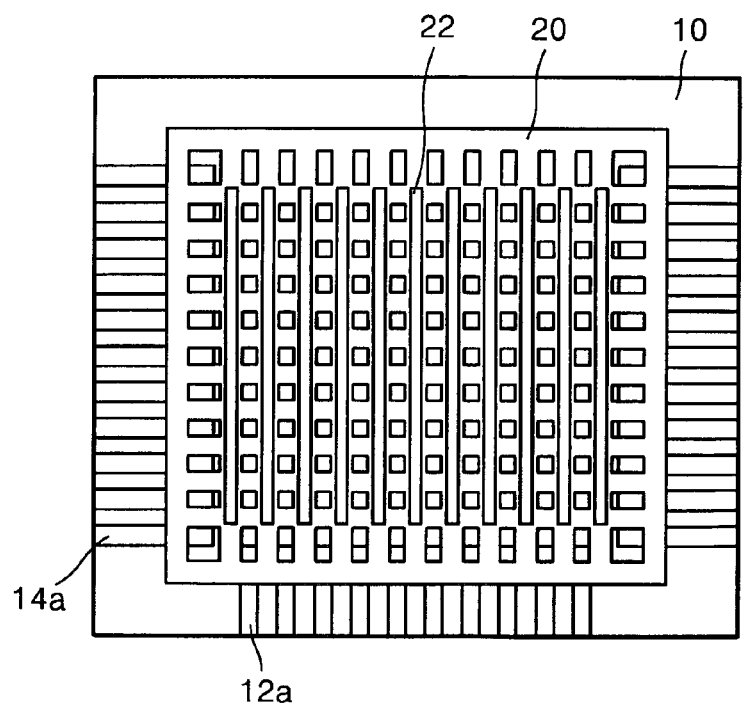
Figure 16:
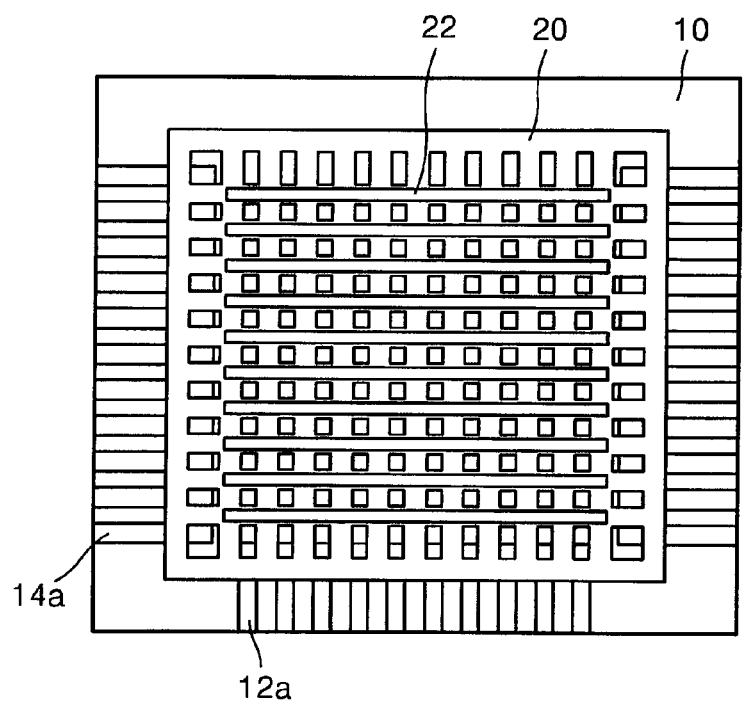

The insulating walls 22 may be formed in various patterns according to the patterns of the inter-insulators 22, as illustrated in FIGS. 12 through 16. For example, when the inter-insulators 20 are formed in a lattice form, the insulating walls 22 can be formed in a closed rectangular line formed along the periphery of light emitting areas defined by the inter-insulators 20, as illustrated in FIG. 12. Also, as illustrated in FIG. 13, the insulating walls 22 can be formed in a lattice pattern along the latticed inter-insulators 20. The insulating walls 22 can be formed in a dot pattern, as illustrated in FIG. 14 in which dots are not interconnected. Also, as illustrated in FIGS. 15 and 16, the insulating walls 22 can be formed in a stripe pattern.

FIGS. 12 through 16 illustrate states in which the inter-insulators 20 and the insulating walls 22 are formed over the first electrode area, in which reference numeral 12a denotes first electrode terminals, which are formed in a stripe pattern in a direction in which the first electrode terminals are arranged, and reference numeral 12b denotes second electrode terminals, along which a second electrode unit will later be formed.

FIG. 15 illustrates the insulating walls 22 formed parallel to a first electrode unit connected to the first electrode terminals 12a, and FIG. 16 illustrates the insulating walls 22 formed to be perpendicular to a first electrode unit connected to the first electrode terminals 12a, that is, parallel to electrode lines constituting a second electrode unit.

Such various patterns of the insulating walls 22 can be applied in the same manner to the structure in which the inter-insulators 20 are of a stripe pattern, formed parallel to the first electrode unit 12, rather than of a lattice pattern.

As described above, as illustrated in FIGS. 12 through 16, the insulating walls 22 having various patterns are easily formed by photolithography, which can be simultaneously performed during the process of forming the inter-insulators 20. Also, the inter-insulators 20 and the insulating walls 22 can be formed by using photoresist or photosensitive polyimide.

In the insulating walls 22 and inter-insulators 20 having the above-described constructions, as illustrated in FIG. 4, a gap between each of the respective electrode lines and each of the insulating walls 22 is not generated when the organic layer 30 and the second electrode unit 14 are formed on the insulating walls 22 and the inter-insulators 20. Rather, the organic layer and the second electrode unit 14 sequentially stacked thereon are gently sloped at the boundary between the insulating walls 22 and the first electrode unit 12. Accordingly, the short-circuit between the first electrode unit 12 and the second electrode unit 14, arising due to thinning of organic layers at the lateral edges of the electrode lines of the first electrode unit 12, can be prevented. Also, as will be described later, even when a second electrode unit or an organic emitter layer is deposited using a deposition mask, a shielding portion of the deposition mask is supported by insulating walls for the deposition mask to prevent damage to the organic layer.

The above-described organic EL device is constructed such that insulating walls 22 are formed on the inter-insulators 20, but the stacked structure thereof may be reversed in the stack sequence.

Figure 5:
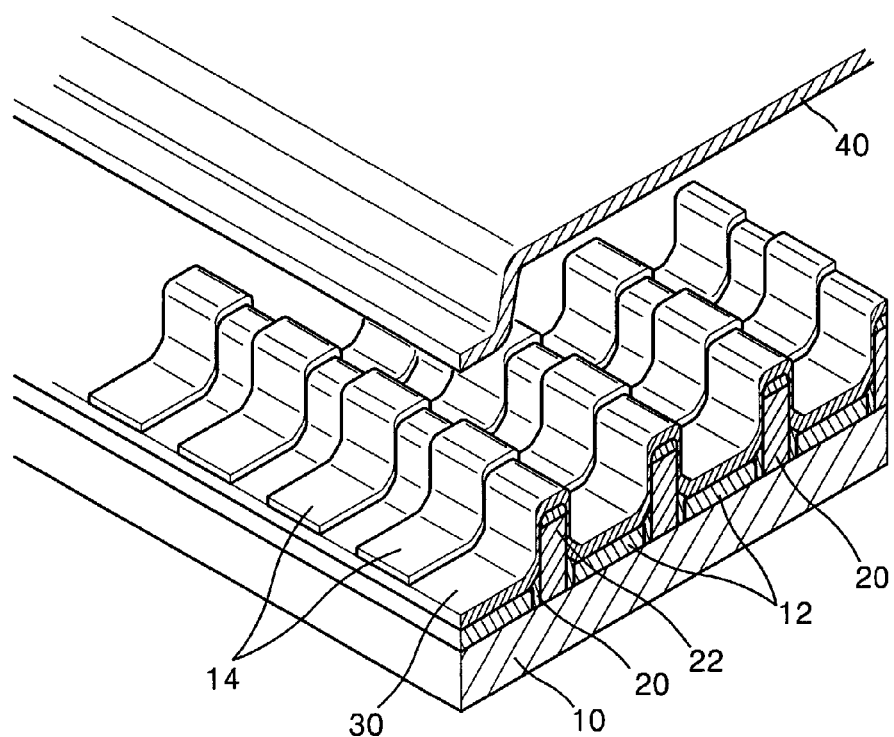
FIG. 5 is a partially exploded perspective view of an organic EL device according to another embodiment of the present invention.
Figure 6:
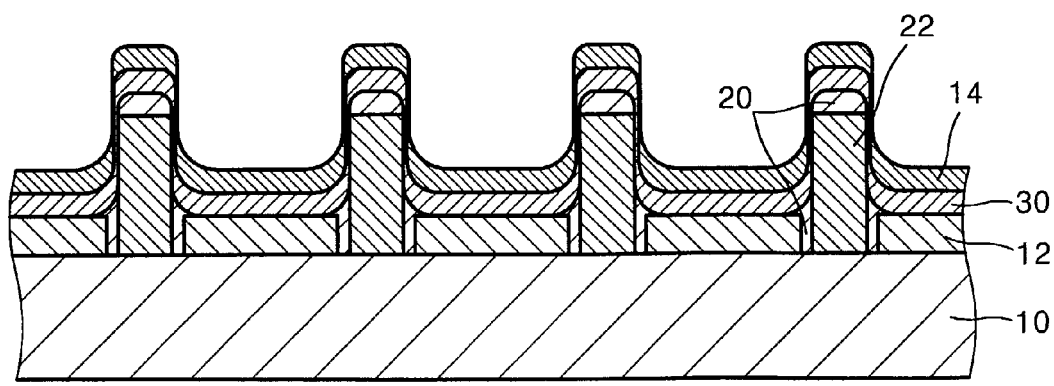
FIG. 6 is a partly cut-away cross-sectional view of the organic EL device illustrated in FIG. 5.

That is, as illustrated in FIGS. 5 and 6, the insulating walls 22 can be formed under the inter-insulators 20. In these structures, like in the structure illustrated in FIG. 4, the inter-insulators 20 are formed between the insulating walls 22 and the lateral edges of the first electrode unit 12 at a predetermined tilt angle, particularly as illustrated in FIG. 6. Accordingly, the organic layer 30 and the second electrode unit 14 deposited on the insulating walls 22 are also gently sloped. Thus, the short-circuit between the lateral edge of the first electrode unit 12 and the second electrode unit 14 can be prevented.

Various patterns of the insulating walls 22 as illustrated in FIGS. 12 through 16, can also be applied to these embodiments, like the above-described embodiments, which is also true of the case where inter-insulators are formed parallel to a first electrode unit.

According to another embodiment of the present invention, the above-described inter-insulators and insulating walls can be integrally formed.

Figure 7:
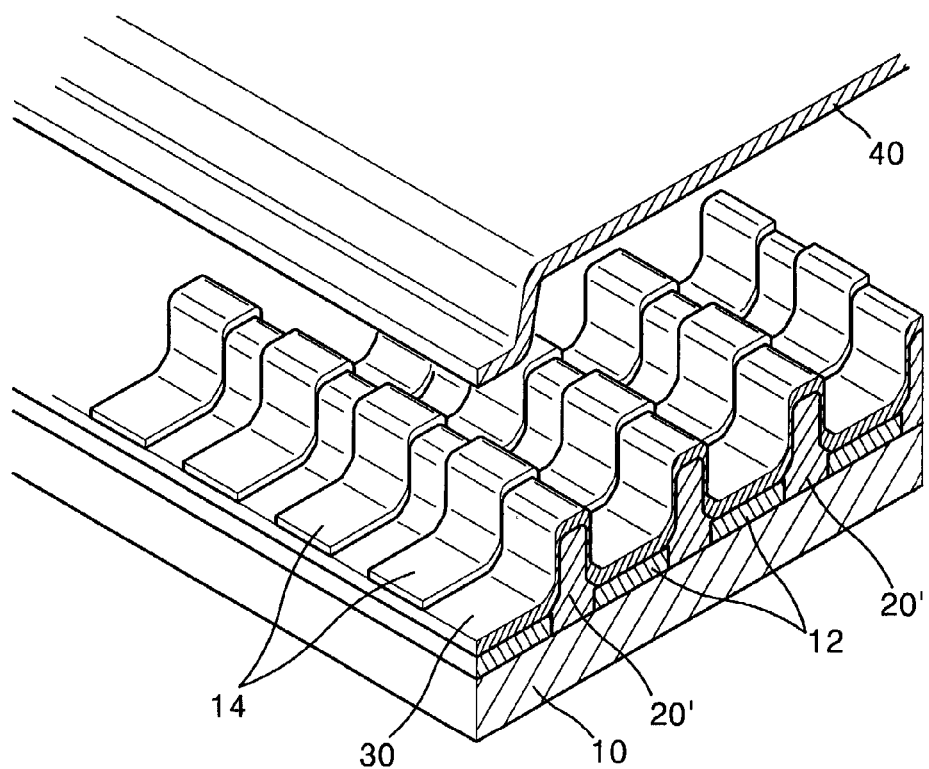
FIG. 7 is a partially exploded perspective view of an organic EL device according to yet another embodiment of the present invention.
Figure 8:
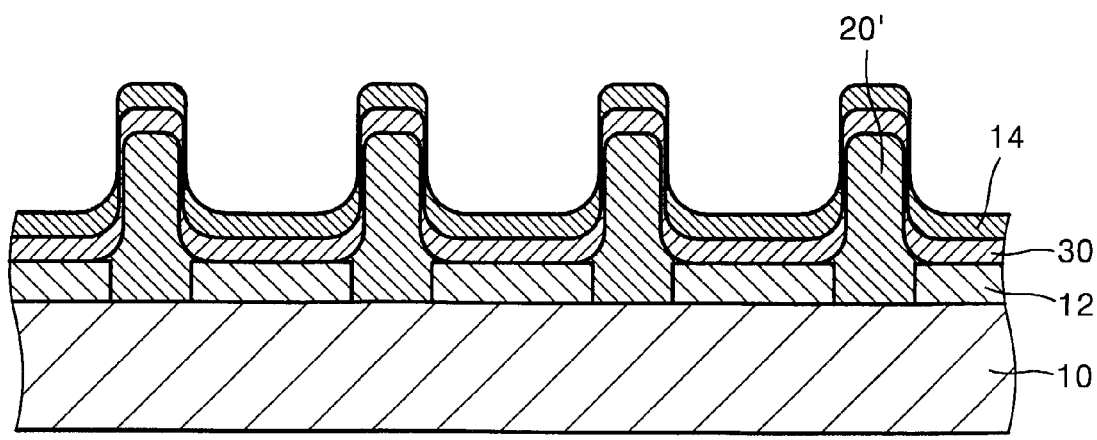
FIG. 8 is a partly cut-away cross-sectional view of the organic EL device illustrated in FIG. 7.

That is, inter-insulators 20' with a predetermined height can be formed, as in illustrated FIGS. 7 and 8. The height of each of the inter-insulators 20' must be greater than the sum of the height of the first electrode unit 12 and the height of the organic layer 30.

As described above, the inter-insulators 20' may have various patterns. That is, the inter-insulators 20' may be formed in a stripe pattern parallel to the respective electrodes of the first electrode unit 12. Also, the inter-insulators 20' may be formed in a lattice pattern so as to partially cover the first electrode unit 12 according to pixels. Further, the inter-insulators 20' may be formed in such patterns as illustrated in FIGS. 12 through 16 by varying the heights of the inter-insulators 20' in part.

The above-described inter-insulators 20' are also formed by photolithography using photoresist or polyimide.

In these embodiments of the present invention, the insulating walls can have various forms.

Figure 9:
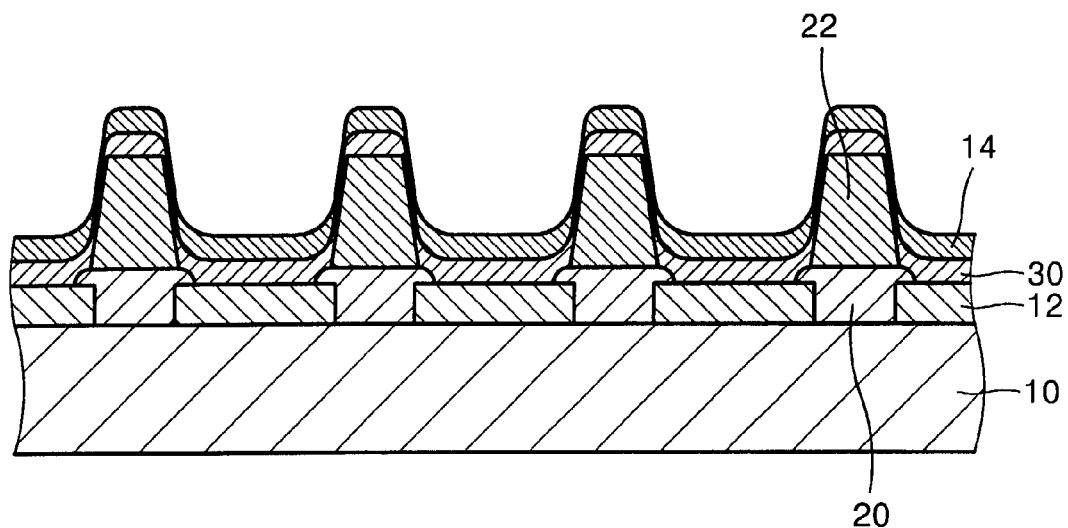
FIGS. 9 through 11 are cross-sectional views of the organic EL devices illustrated in FIGS. 3, 5 and 7 having trapezoidal partition walls, respectively.
Figure 10:
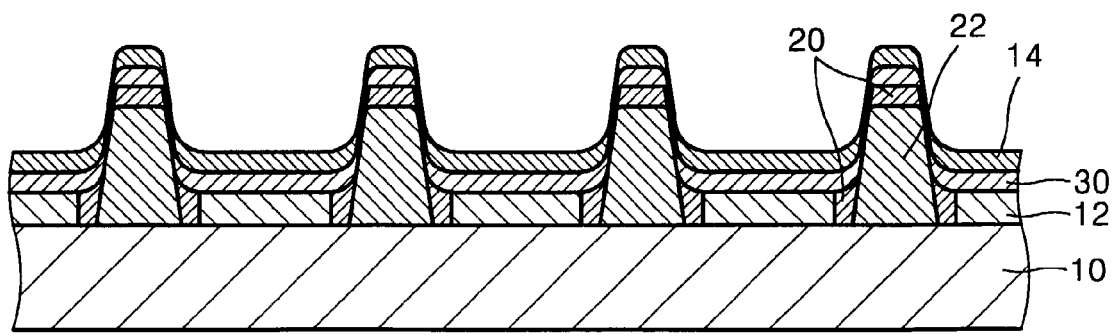
Figure 11:
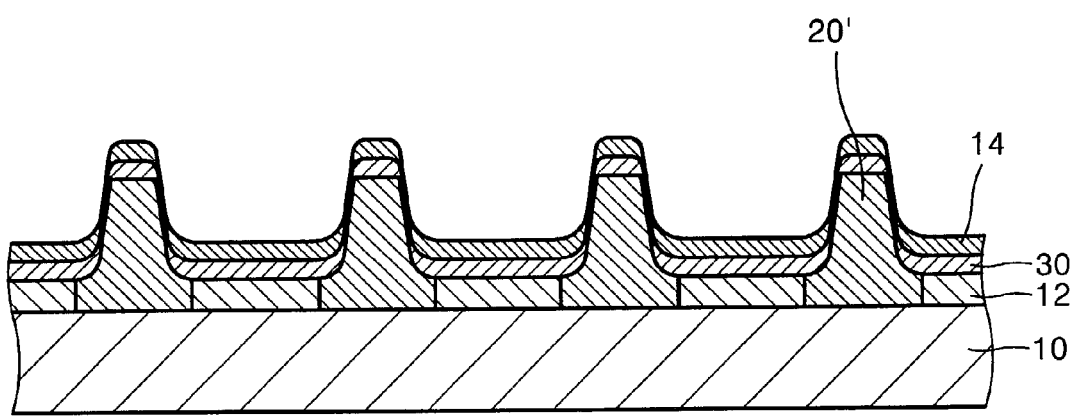

That is to say, the cross-section of each insulating wall according to the embodiments of the present invention may be rectangular, as illustrated in FIGS. 3 through 8, or trapezoidal, as illustrated in FIGS. 9 through 11. Preferably, in order for the organic layer 30 and the second electrode unit 14 deposited on the insulating walls 22 to be gently sloped between the insulating walls 22 and the lateral edges of the first electrode unit 12, the cross-section of each of the insulating walls 22 is trapezoidal so that the surface thereof facing the transparent substrate 10 is wider than the top surface thereof, as illustrated in FIGS. 9 through 11.

FIGS. 17 through 21C illustrate a method of manufacturing an organic EL device according to several embodiments of the present invention.

Figure 17:
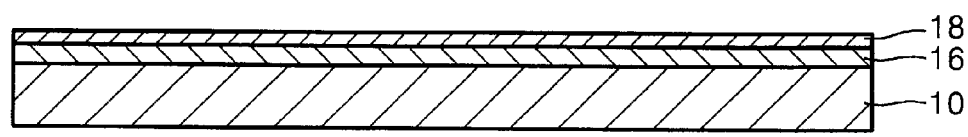
FIGS. 17 through 21C illustrate sequential operations of a method of manufacturing an organic EL device according to the embodiments of the present invention.
Figure 18A:
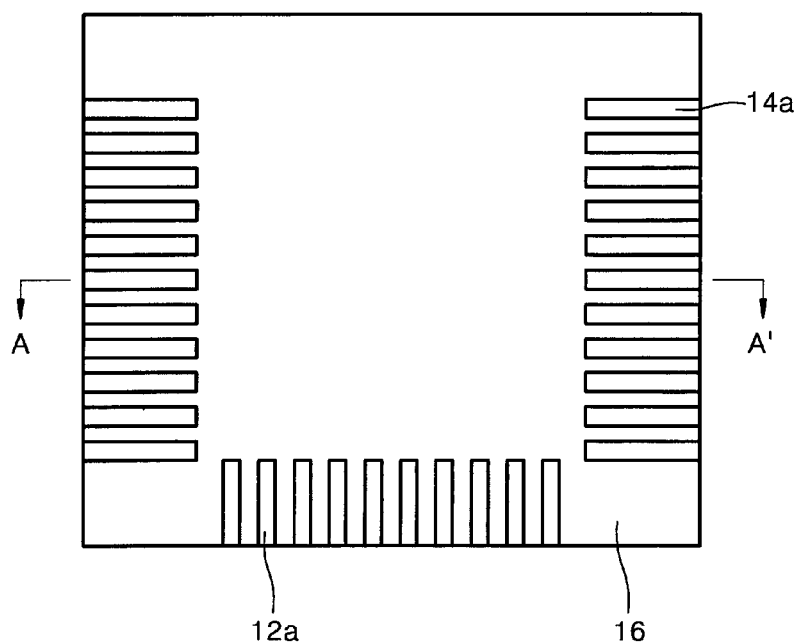
Figure 18B:
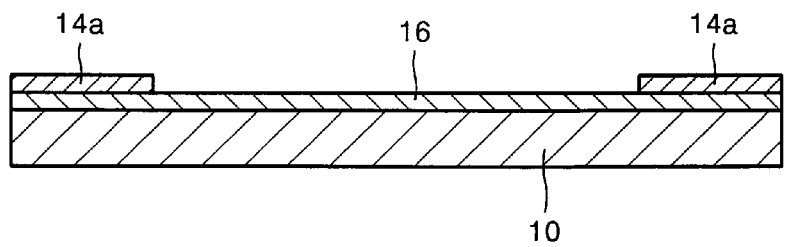
Figure 19A:
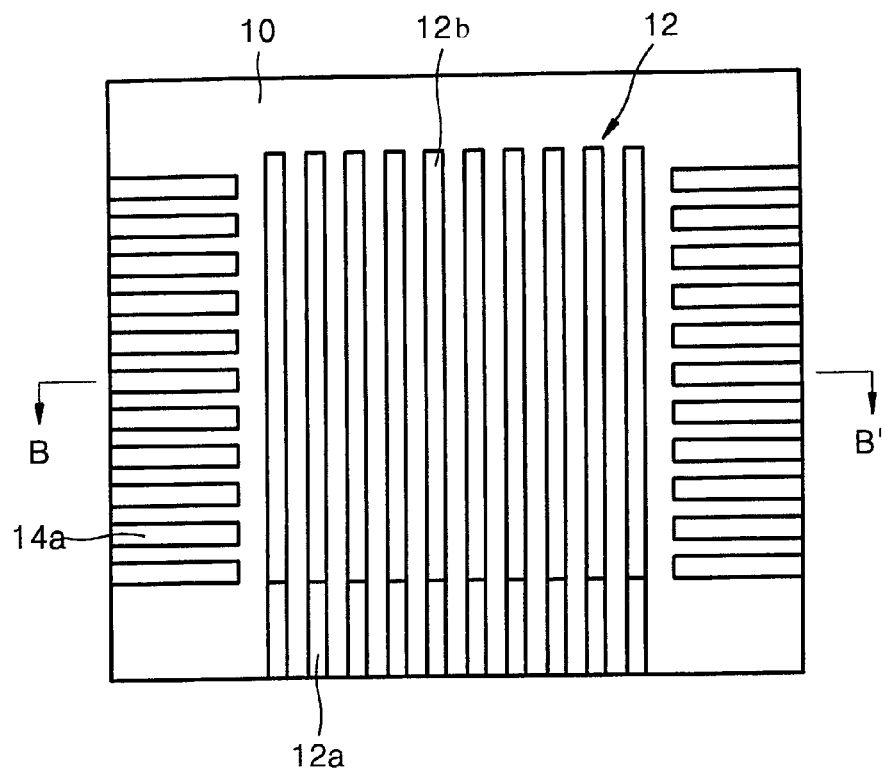
Figure 19B:
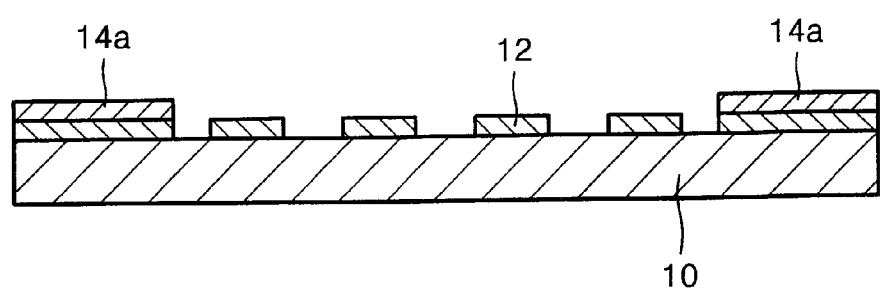

In order to manufacture the organic EL device, a transparent substrate 10 having a transparent conductive layer 16 and a metal conductive layer 18 stacked thereon is first prepared, as illustrated in FIG. 17. The metal conductive layer 18 formed on the transparent substrate 10 is processed to form first and second electrode terminals 12a and 14a at the edges of the transparent substrate 10, as illustrated in FIGS. 18A and 18B. FIG. 18B is a cross-sectional view of FIG. 18A taken along the line A–A'. If formation of the first and second electrode terminals 12a and 14a is completed in such a manner, the transparent conductive layer 16 exposed to the transparent substrate 10 is processed to form lines 12b of the first electrode unit 12 with a predetermined pattern respectively connected to the first electrode terminals 12a, as illustrated in FIGS. 19A and 19B. FIG. 19B is a cross-sectional view of FIG. 19A taken along the line B–B'. The first electrode unit 12 can be formed using the transparent conductive layer 16 by photolithography, not limited thereto, and can be directly formed by deposition.

Figure 20:
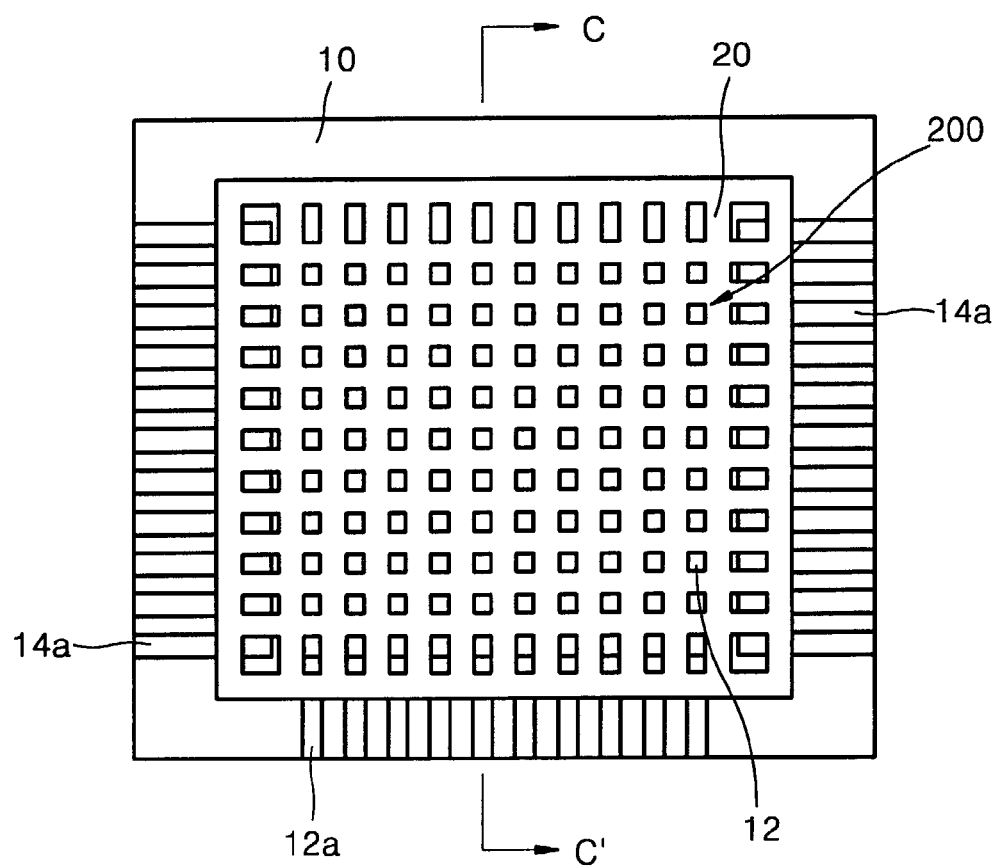

Next, as illustrated in FIG. 20, inter-insulators 20 formed in a stripe or lattice pattern to define the first electrode unit 12 positioned on effective areas, that is, light emitting areas 200, are formed on the substrate 10 having the first and second electrode terminals 12a and 14a and the first electrode unit 12. FIG. 20 illustrates a state in which inter-insulators 20 are formed in a grid pattern, that is, in a lattice pattern, according to an embodiment of the present invention, but is not limited thereto. In the figure, the first electrode unit 12 is defined by the latticed inter-insulators 20 to open the respective light emitting areas 200. As described above, the inter-insulators 20 may also be formed by photolithography. In addition to photoresist, polyimide can be used.

As illustrated in FIGS. 12 through 16, insulating walls with various patterns can be formed on inter-insulators provided on a transparent substrate. The insulating walls can be formed of the same materials as those of inter-insulators, and can be simultaneously formed with the formation of the inter-insulators. In other words, after forming the inter-insulators by photolithography, the insulating walls can be formed by repeated photolithography. Otherwise, the insulating walls and the inter-insulators can be integrally formed by a single step of photolithography.

Shielding walls can also be formed when forming the insulating walls, the shielding walls to prevent ingress of an adhesive agent into effective areas of the substrate when sealing a cap with the substrate along the edges of the overall effective areas containing the light emitting areas, or to prevent egress of an adhesive agent to electrode terminals.

Figure 21A:
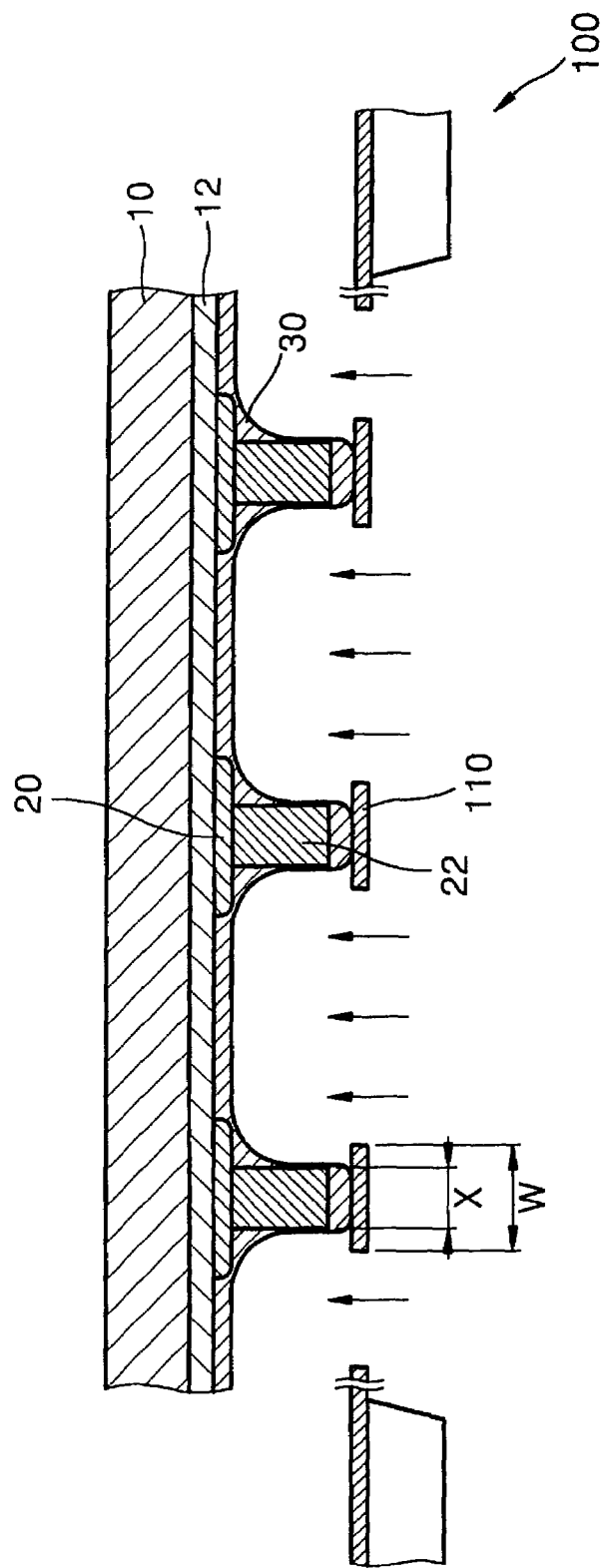
Figure 21B:
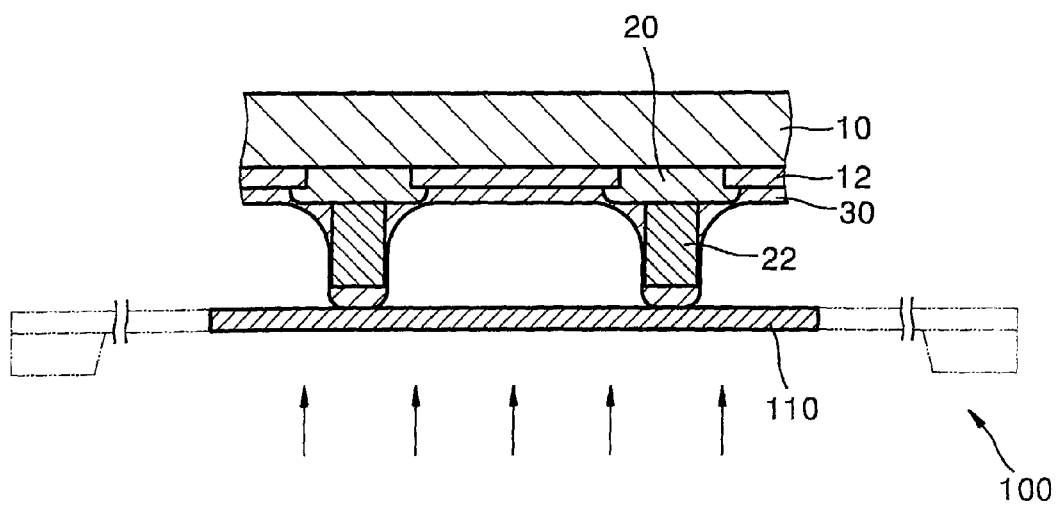
Figure 21C:
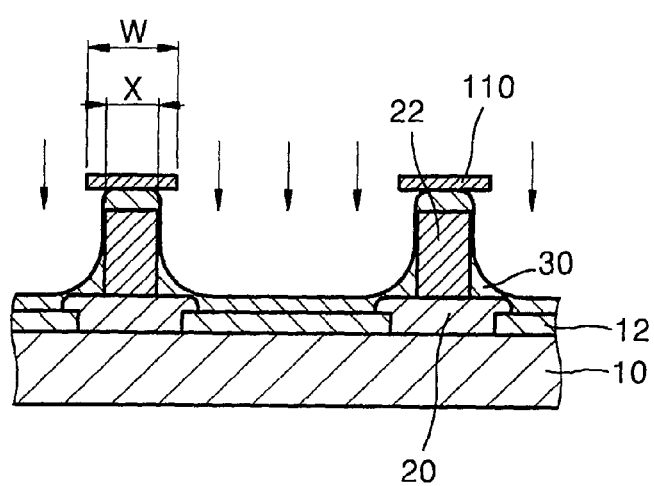

Next, an organic layer is deposited in the effective areas, and a second electrode unit electrically connected to the second electrode terminals 14a is deposited using a deposition mask. Here, the second electrode unit can be deposited using a deposition mask having patterned slits. As illustrated in FIG. 21A, a metal shielding portion 110 forming slits of a deposition mask 100 is in close contact with the insulating walls 22. Although not shown, for the purpose of increasing the contacting of the deposition mask 100, a magnetic device may be provided at the opposite side of the deposition mask 100.

FIG. 21A illustrates the state in which the second electrode unit is deposited when viewed along the line C–C' illustrated in FIG. 20. As illustrated in FIG. 21A, the thickness X of each wall body of the insulating walls 22 is preferably narrower than the width W of the shielding portion 110 of the deposition mask 100.

When formation of an organic layer and second electrode lines is completed in the above-described manner, a cap for sealing is adhered to the substrate 10.

As described above, according to the present invention, in forming an electroluminescent layer or cathode using a deposition mask, damage of an organic layer can be prevented by use of the deposition mask.

Also, the electroluminescent layer and the second electrode unit deposited between each of the respective electrode lines of the first electrode unit can be naturally connected, thereby preventing deterioration of layer characteristics due to nonuniform thickness of the electroluminescent layer deposited, and preventing the short-circuit between the first electrode unit and the second electrode unit at the lateral surfaces of the electrode lines of the first electrode unit.

According to the present invention, inter-insulators and insulating walls are simultaneously formed, thereby improving the manufacturability.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic electroluminescent display (EL) device comprising:
   a substrate made of a transparent material;
   a first electrode unit having a plurality of electrodes formed on the substrate in a predetermined pattern;
   a second electrode unit having a plurality of electrodes arranged in a direction crossing the first electrode unit;
   an electroluminescent layer disposed between the first electrode unit and the second electrode unit and configured to cover at least the first electrode unit and to emit light at the intersection of the first and second electrode units;
   inter-insulators positioned under the electroluminescent layer to cover at least spaces between each of the respective electrodes of the first electrode unit, and configured to define the first electrode unit as a plurality of light emitting areas and to prevent a short-circuit between the first electrode unit and the second electrode unit; and
   insulating walls positioned on at least one of the top and bottom surfaces of the inter-insulators.

2. The organic EL device of claim 1, wherein the insulating walls are formed according to the arrangement pattern of the inter-insulators.

3. The organic EL device of claim 1, wherein the insulating walls are formed in a stripe pattern extending parallel to the first electrode unit.

4. The organic EL device of claim 1, wherein the insulating walls are formed in a stripe pattern extending parallel to the second electrode unit.

5. The organic EL device of claim 1, wherein the insulating walls are formed along the periphery of areas where the inter-insulators are formed.

6. The organic EL device of claim 1, wherein the insulating walls include portions formed in a dot pattern having dots not interconnected.

7. The organic EL device of claim 1, wherein the sum of the height of each of the inter-insulators and the height of each of the insulating walls is greater than the sum of the height of the first electrode unit and the height of the electroluminescent layer.

8. The organic EL device of claim 1, wherein the width of each of the insulating walls is equal to or less than the width of each of the inter-insulators.

9. The organic EL device of claim 1, wherein the cross-section of each of the insulating walls is trapezoidal so that the surface thereof facing the transparent substrate is wider than the top surface thereof.

10. The organic EL device of claim 1, wherein the inter-insulators and the insulating walls are integrally formed.

11. An organic EL device comprising:
    a substrate made of a transparent material;
    a first electrode unit having a plurality of electrodes formed on the substrate in a predetermined pattern;
    a second electrode unit having a plurality of electrodes arranged in a direction crossing the first electrode unit;
    an electroluminescent layer disposed between the first electrode unit and the second electrode unit and configured to cover at least the first electrode unit and to emit light at the intersection of the first and second electrode units; and
    inter-insulators positioned under the electroluminescent layer to cover at least spaces of each of the respective electrodes of the first electrode unit, and configured to define the first electrode unit as a plurality of light emitting areas and to prevent a short-circuit between the first electrode unit and the second electrode unit, each of the inter-insulators having a height greater than the sum of the height of the first electrode unit and the height of the electroluminescent layer.

12. The organic EL device of claim 11, wherein the inter-insulators are formed in a stripe pattern parallel to the first electrode unit.

13. The organic EL device of claim 11, wherein the inter-insulators are formed in a lattice pattern covering spaces between each of the respective electrode lines of the first electrode unit and partially covering the first electrode unit.

14. The organic EL device of claim 11, wherein the cross-section of each of the inter-insulators is trapezoidal so that the surface thereof facing the transparent substrate is wider than the top surface thereof.

15. A method of manufacturing an organic EL device comprising:
    forming a first electrode unit on a transparent substrate in a predetermined pattern;

forming inter-insulators on the transparent substrate to cover at least spaces of each of the respective electrodes of the first electrode unit, and patterned to define the first electrode unit as a plurality of light emitting areas;

forming insulating walls positioned on at least one of the top and bottom surfaces of the inter-insulators;

forming an electroluminescent layer over the first electrode unit, the inter-insulators and the insulating walls; and forming a second electrode unit arranged in a direction crossing the first electrode unit by closely contacting a deposition mask with the top portion of the each of the insulating walls.

16. The method of claim 15, wherein the thickness of each of the insulating walls is less than the width of each of the inter-insulators.

17. The method of claim 15, wherein the thickness of each of the insulating walls is less than the width of a shielding portion forming slits of the deposition mask.

18. The method of claim 15, wherein the inter-insulators and the insulating walls are simultaneously formed.

19. The organic EL device according to claim 13, wherein the insulating walls are formed in a closed rectangular line formed along the latticed inter-insulators.

20. The organic EL device according to claim 1, wherein the electroluminescent layer and the second electrode unit are sequentially stacked and gently sloped at a boundary between the insulating walls and the first electrode unit.

21. The organic EL device according to claim 1, wherein the inter-insulators are formed to vary in height.

22. The method according to claim 15, wherein the insulating walls and the inter-insulators are formed by photolithography.

23. The method according to claim 15, wherein the insulating walls and the inter-insulators are formed using photoresist.

24. The method according to claim 15, wherein the insulating walls and the inter-insulators are formed using photosensitive polymide.

25. An organic electroluminescent display (EL) device comprising:

a substrate made of a transparent material;
a first electrode unit having a plurality of electrodes formed on the substrate in a predetermined pattern;
a second electrode unit having a plurality of electrodes arranged in a direction crossing the first electrode unit;
an electroluminescent layer disposed between the first electrode unit and the second electrode unit and configured to cover at least the first electrode unit and to emit light at the intersection of the first and second electrode units;
insulating walls positioned under the electroluminescent layer to cover at least spaces between each of the respective electrodes of the first electrode unit, and configured to define the first electrode unit as a plurality of light emitting areas and to prevent the short-circuit between the first electrode unit and the second electrode unit; and
inter-insulators positioned on at least one of the top and bottom surfaces of the insulating walls.

26. An organic electroluminescent display (EL) device comprising:

a substrate made of a transparent material;
a first electrode unit having a plurality of electrodes formed on the substrate in a predetermined pattern;
a second electrode unit having a plurality of electrodes arranged in a direction parallel with the first electrode unit;
an electroluminescent layer disposed between the first electrode unit and the second electrode unit and configured to cover at least the first electrode unit and to emit light between the first and second electrode units;
inter-insulators positioned under the electroluminescent layer to cover at least spaces between each of the respective electrodes of the first electrode unit, and configured to define the first electrode unit as a plurality of light emitting areas and to prevent the short-circuit between the first electrode unit and the second electrode unit; and
insulating walls positioned on at least one of the top and bottom surfaces of the inter-insulators.

27. An electroluminescent display (EL) device comprising:

a substrate made of a transparent material;
a first electrode unit having a plurality of electrodes formed on the substrate in a predetermined pattern;
a second electrode unit having a plurality of electrodes arranged in a direction crossing the first electrode unit;
an electroluminescent layer disposed between the first electrode unit and the second electrode unit and configured to cover at least the first electrode unit and to emit light at the intersection of the first and second electrode units;
inter-insulators positioned under the electroluminescent layer to cover at least spaces between each of the respective electrodes of the first electrode unit, and configured to define the first electrode unit as a plurality of light emitting areas and to prevent the short-circuit between the first electrode unit and the second electrode unit; and
insulating walls positioned on at least one of the top and bottom surfaces of the inter-insulators.

28. An EL device comprising:

a substrate made of a transparent material;
a first electrode unit having a plurality of electrodes formed on the substrate in a predetermined pattern;
a second electrode unit having a plurality of electrodes arranged in a direction crossing the first electrode unit;
an electroluminescent layer disposed between the first electrode unit and the second electrode unit and configured to cover at least the first electrode unit and to emit light at the intersection of the first and second electrode units; and
inter-insulators positioned under the electroluminescent layer to cover at least spaces of each of the respective electrodes of the first electrode unit, and configured to define the first electrode unit as a plurality of light emitting areas and to prevent a short-circuit between the first electrode unit and the second electrode unit, each of the inter-insulators having a height greater than the sum of the height of the first electrode unit and the height of the electroluminescent layer.

* * * * *

UNITED STATES PATENT AND TRADEMARK OFFICE
CERTIFICATE OF CORRECTION

PATENT NO.        : 7,091,666 B2                                       Page 1 of 1
APPLICATION NO. : 10/289301
DATED             : August 15, 2006
INVENTOR(S)       : Seon-Hee Kim et al.

It is certified that error appears in the above-identified patent and that said Letters Patent is hereby corrected as shown below:

Title Page
(73) Assignee, change "Samsung Oled Co., Ltd., Ulsan-si (KR)" to -- Samsung SDI Co., Ltd., Suwon-si (KR) --

Signed and Sealed this

Eighth Day of May, 2007

JON W. DUDAS
*Director of the United States Patent and Trademark Office*